United States Patent [19]
Hsu

[11] Patent Number: 5,569,045
[45] Date of Patent: Oct. 29, 1996

[54] ELECTRICAL CONNECTOR

[76] Inventor: Fu-Yu Hsu, No. 1-2, Lane 975, Chun-Jih Road, Tao-Yuan City, Taiwan

[21] Appl. No.: 384,876

[22] Filed: Feb. 7, 1995

Related U.S. Application Data

[63] Continuation-in-part of Ser. No. 194,309, Feb. 10, 1994, Pat. No. 5,454,727.

[51] Int. Cl.$^6$ .................................................. H01R 13/62
[52] U.S. Cl. .......................................... 439/342; 439/259
[58] Field of Search .......................... 439/342, 259–265, 439/267

[56] References Cited

U.S. PATENT DOCUMENTS

| | | | |
|---|---|---|---|
| 4,648,669 | 3/1987 | Marks et al. | 439/342 |
| 5,092,789 | 3/1992 | Sinclair | 439/342 |
| 5,342,214 | 8/1994 | Hsu | 439/342 |

*Primary Examiner*—Hien D. Vu
*Attorney, Agent, or Firm*—Morton J. Rosenberg; David I. Klein

[57] ABSTRACT

An improved electrical connector is provided that is especially designed for the terminals and drivers of high density ZIF sockets. The terminals used are punched from a strip of metal and formed into a long support piece and a short support piece. The two support pieces respectively form first and second contacts, which provides the connector with both upper and lower conducting surfaces. By virtue of that structure, the terminals can be placed within slots formed in the socket, and can make effective conductive contact with respective PGA pins inserted into the socket.

2 Claims, 7 Drawing Sheets

ELECTRICAL CONNECTOR

This is a continuation-in-part of Ser. No. 194,309, filed Feb. 10, 1994 now U.S. Pat. No. 5,454,727 issued Oct. 3, 1995.

BACKGROUND OF THE INVENTION

FIELD OF THE INVENTION

This invention relates to an electrical connector, and more particularly, to a high density zero-insertion-force (ZIF) electrical connector.

PRIOR ART

Prior art ZIF sockets are more practical and convenient than typical low-insertion-force (LIF) sockets and are becoming increasingly more precise due to advances in technology and rising computer processor speeds. Therefore, ZIF sockets will eventually come to dominate the market. On very small scale ZIF connectors, it is desirable to form very small insertion holes and to form those holes as densely as possible. On such a ZIF socket, the terminals positioned inside the holes must be designed so that they will fit into the smaller holes in tight conducting contact with the pins. In addition, the design of the ZIF driver mechanism must allow the sliding base to move smoothly inside the body of the socket to achieve its desired effect.

However, the operation and contact effect of ZIF sockets at present have yet to achieve an ideal state. For instance, there is only a single point of contact between each pin and the terminal. Loss of resiliency of a terminal, therefore, results in poor electrical connection to its associated pin. Furthermore, when the driving lever moves the sliding base to the side, the end of the sliding base will frequently pop up during driving due to the poor positioning of the driver section between the socket and the sliding base. This can result in damage to the sliding base and adversely effect the overall quality of the electrical connector.

SUMMARY OF THE INVENTION

It is a primary object of this invention to provide an electrical connector which, by means of a specially designed terminal, enables the terminal to be pressed and formed from a single piece of metal, which terminal will include two non-opposing contact sections allowing two contact points to form between the pins and terminals so as to insure proper electrical connection.

It is still a further object of this invention to provide an electric connector which, by means of clever positioning of the driving rod and socket, prevents the end of the sliding base from popping up when the sliding base is being moved. This will lower the defect rate and also allow the sliding base to slide smoothly, thus, enhancing the tightness of connections between each of the pins and terminals.

DETAILED DESCRIPTION OF THE PREFERRED EMBODIMENTS

Figure 1:
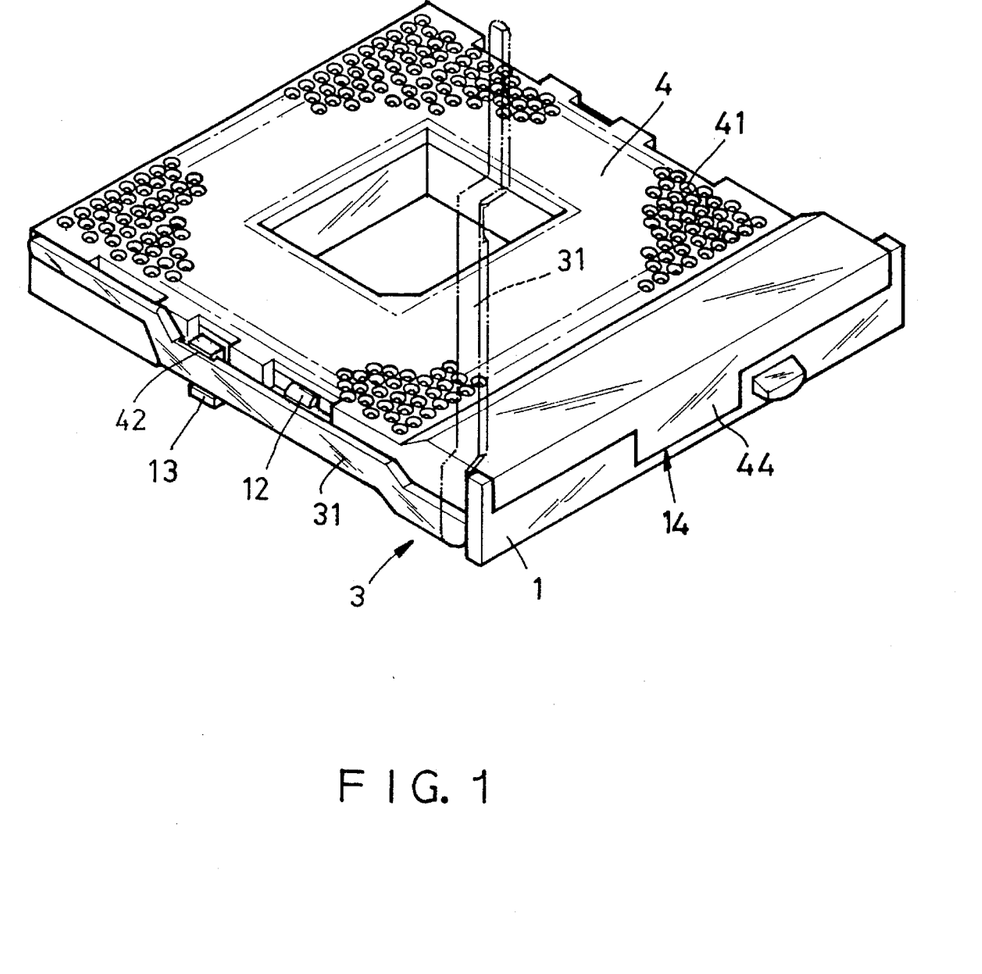
FIG. 1 is a perspective view of an electrical connector according to this invention.
Figure 2:
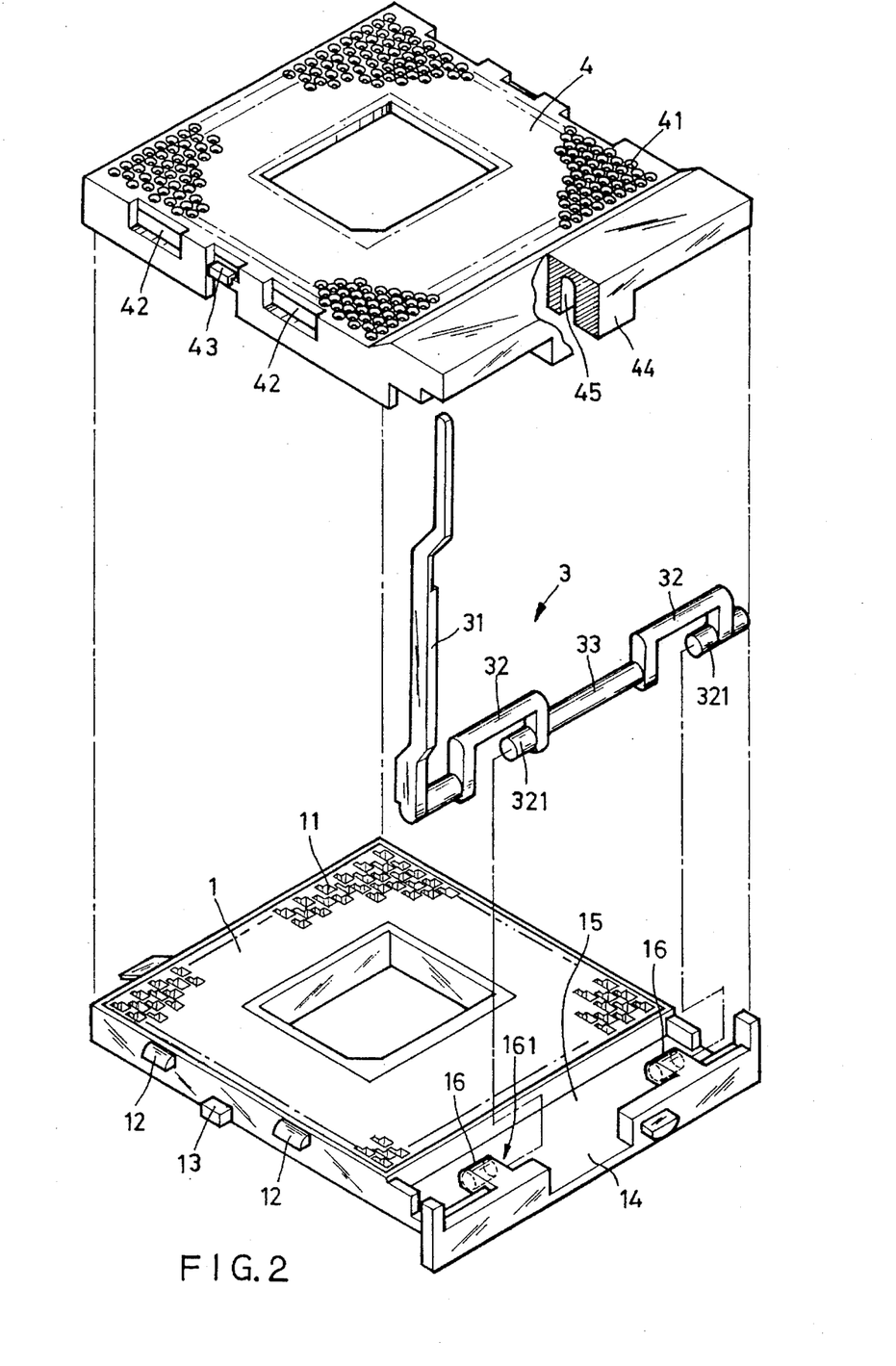
FIG. 2 is an exploded perspective view of an electrical connector according to this invention.

Referring to FIGS. 1 and 2, an electrical connector includes a socket 1 provided with numerous slots 11 formed therein and arranged in a grid pattern for receiving terminals 2 respectively therein. A pair of opposing side edges each have two stoppers 12, each with an arcuate upper surface contour, and a positioning block 13. A front edge has a notch 14, the front edge extending inwardly to form a horizontal surface 15. Horizontal surface 15 includes a pair of positioning flanges 16 disposed thereon, each with a positioning hole 161 formed in one side thereof.

A driving rod 3 is positioned adjacent surface 15 of socket 1 and rotatively coupled to the two positioning flanges 16 by pegs 321 being disposed within a respective positioning hole 161. Driving rod 3 includes an outer end having a lever arm 31 formed thereon.

A sliding base 4 is provided with a plurality of insertion holes 41 formed therethrough, and positioned opposite the slots 11 of socket 1. Two elongated insets 42 are provided on each side wall of the sliding base 4 for receiving the stoppers 12 of socket 1 therein. A stopping catch 43 is formed on the side for securing lever arm 31 of driving rod 3. A protrusion 44 is formed at the bottom of the driving base 4, opposite the notch 14 of socket 1. An inner lower edge of protrusion 44 includes a slot 45 for rotatively receiving center driving section 33 of driving lever 3 therein. Sliding base 4 is inserted on the upper surface of socket 1, whereby the rotation of driving lever 31 enables sliding base 4 to slide relative to socket 1.

Figure 3A:
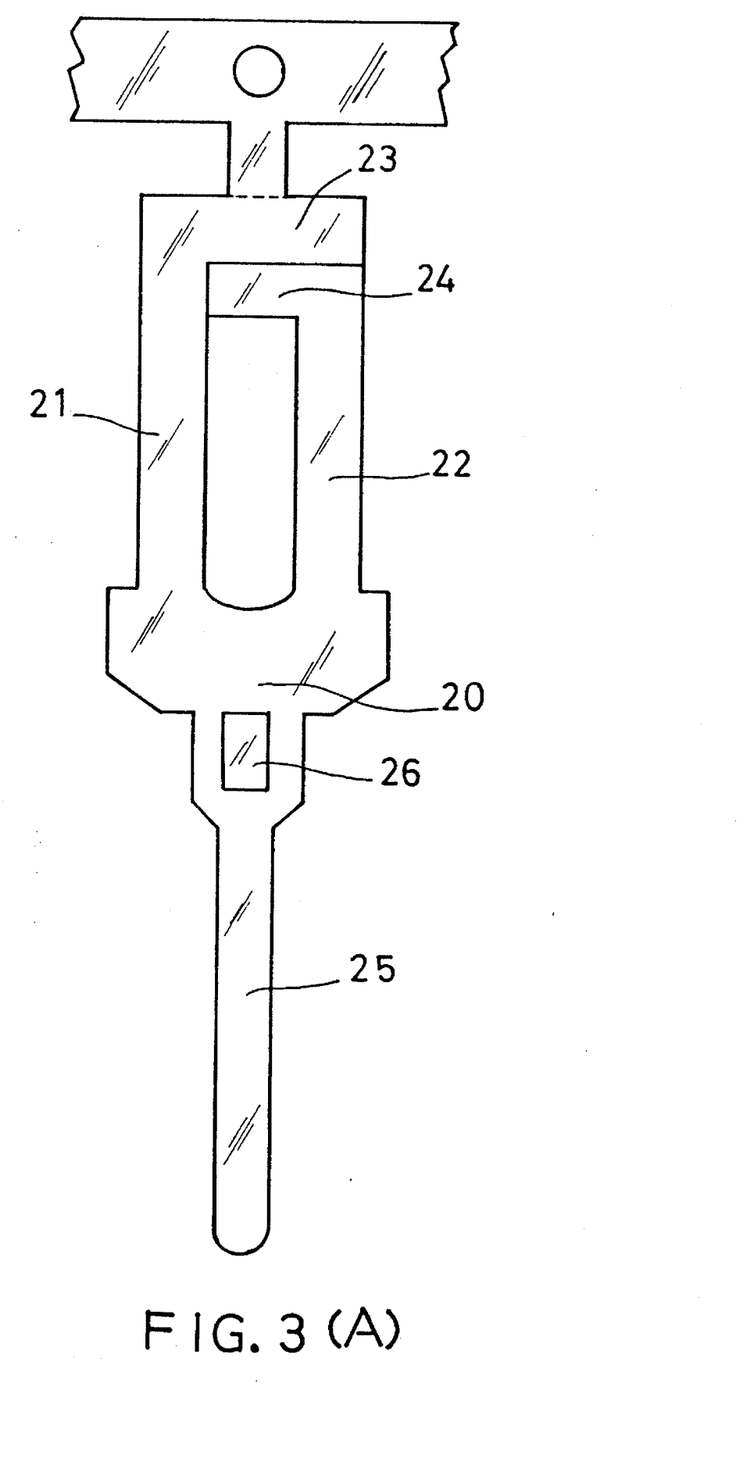
FIG. 3(A) is a perspective view of an electrical terminal according to this invention.
Figure 3B:
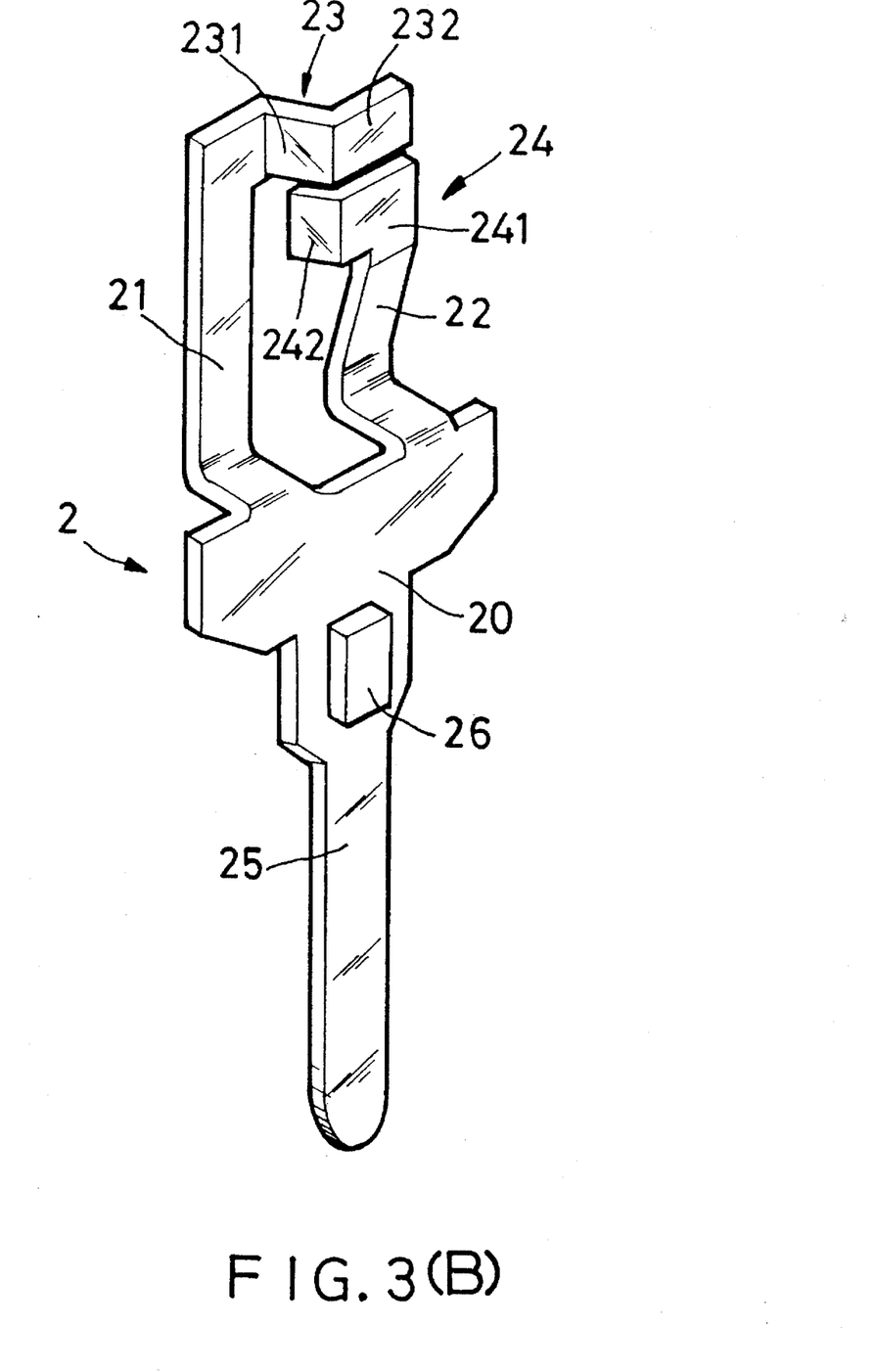
FIG. 3(B) is a side elevational view of an electrical terminal according to this invention.

Referring to FIG. 3(A), a terminal 2 is punched and formed from a metal piece. Terminal 2 includes a long flexible support 21 and a short flexible support 22. Upper edges of long flexible support 21 and short flexible support 22 are formed, respectively, into upper and lower contacts, a first contact section 23 and a second contact section 24. Referring to FIG. 3(B), long and short flexible support 21 and 22 are folded as shown. Long flexible support 21 extends from a stopper section 20 at one end thereof to a location over the center portion of stopper 20 at the other end. A sloping contact surface 231 extends from the end of the flexible support 21 to a laterally extending portion forming an upper contact surface 232. Short flexible support 22 extends from stopper section 20 to form a second contact section 24 having a lower conducting surface 241 extending parallel to upper conducting surface 232 and a lead surface 242 extending from and sloping outwardly from lower conducting surface 241. Terminal 2, thus, uses a punched and formed metal piece having both upper and lower, non-opposing conducting surfaces enabling the PGA pins to be reliably coupled thereto. Terminal 2 includes a contact base 25 and a stopping flange 26 disposed at the bottom of stopper 20.

Figure 4:
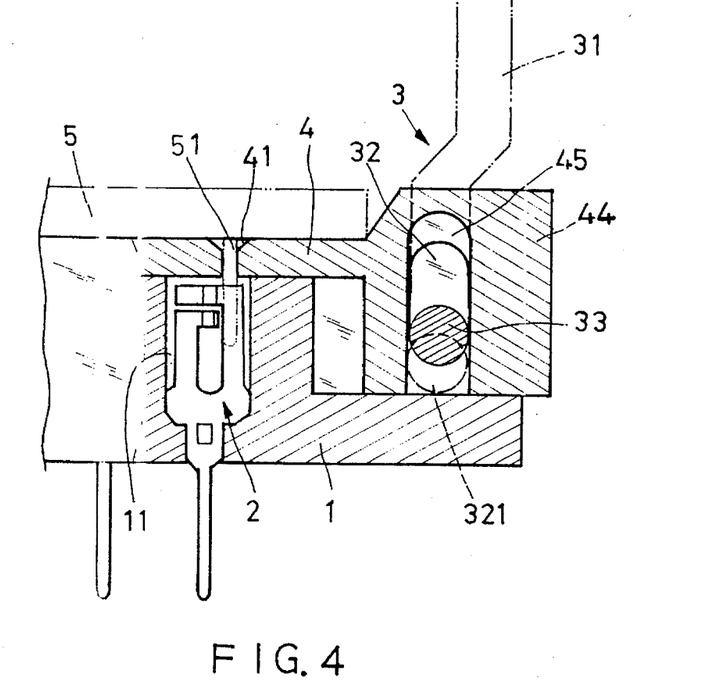
FIG. 4 is a cross-sectional side view of the connector in the "off" position.
Figure 5:
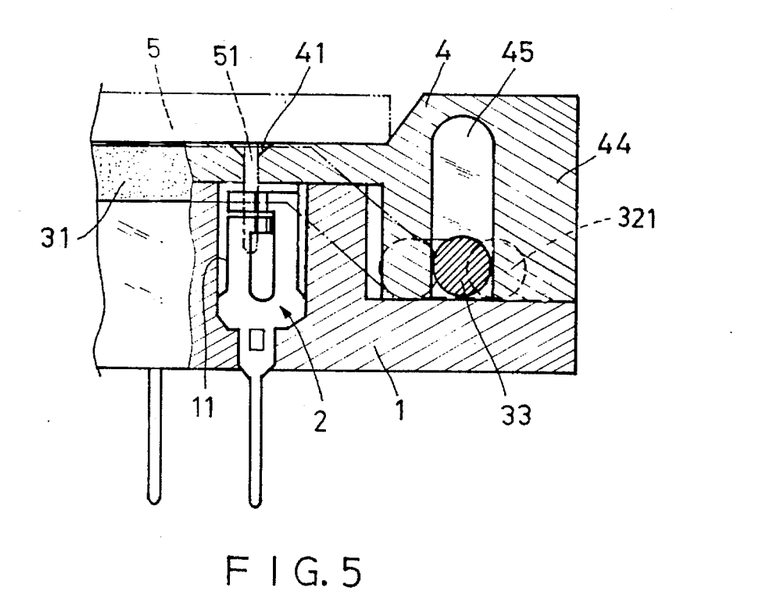
FIG. 5 is a cross-sectional side view of the connector in the "on" position.

Referring to FIGS. 4 and 5, when terminal 2 is inserted in the slots 11 inside socket body 1, pins 51 of PGA package 5 inserts through insertion holes 41 of sliding base 4 and enters into slots 11 inside socket body 1. As shown in FIG. 4, when lever arm 31 of driver rod 3 is in the upright "off" position, pins 51 have yet to connect terminals 2. At this time, PGA package 5 can be easily removed from sliding base 4. As shown in FIG. 5, lever arm 31 is displaced 90 degrees from the "off" position, referred to as the "on" position. Displacement of lever arm 31 forces sliding base 4 to move, along with PGA package 5, to the side, which in turn, causes pins 51 of PGA package 5 to make contact with a respective terminal 2. The details of this lever arm action are described below.

Figure 6A:
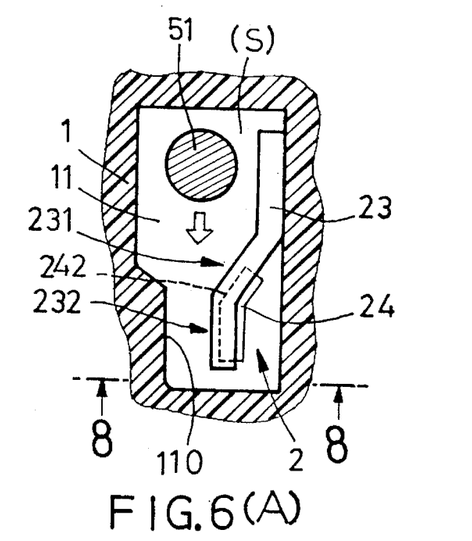
FIG. 6(A) is a cross-sectional plan view of the pin grid array (PGA) package pins in the "off" position.
Figure 6B:
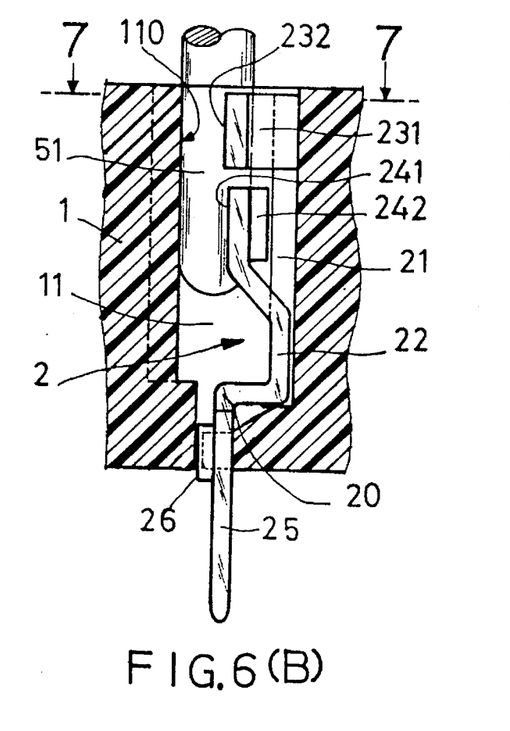
FIG. 6(B) is a cross-sectional front view of the PGA package pins in the "off" position.
Figure 7A:
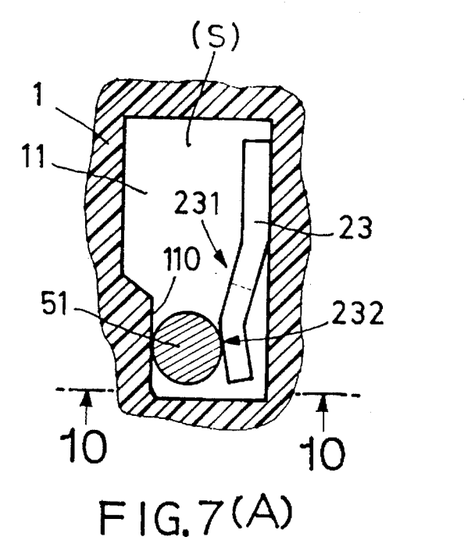
FIG. 7(A) is a cross-sectional plan view of the PGA package pins in the "on" position.
Figure 7B:
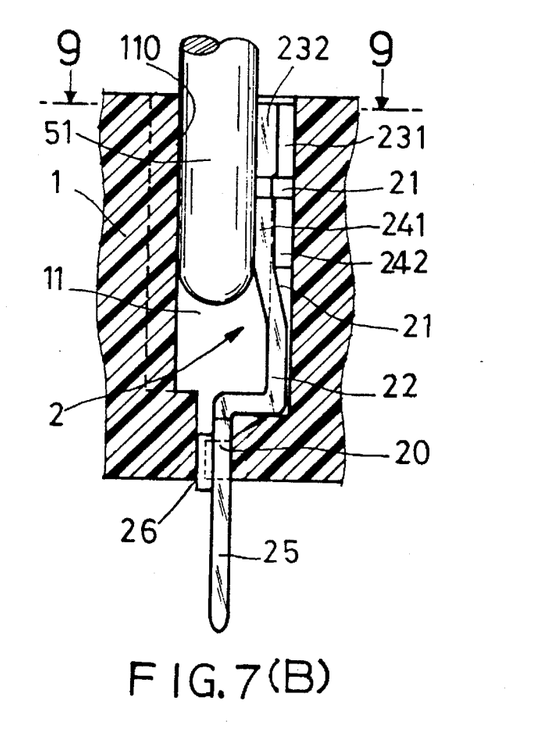
FIG. 7(B) is a cross-sectional front view of the PGA package pins in the "on" position.

Referring to FIG. 6(A) and FIG. 6(B), when pin 51 is inserted into slot 11, pin 51 is positioned in a wider section of slot 11. At this time, sliding base 4 is in the "off" position of FIG. 4. When sliding base 4 moves to the side, pin 51 first comes into contact with sloping contact section 231 and lead surface 242. Referring to FIG. 7(A) and FIG. 7(B), upon further sliding of sliding base 4, pin 51 eventually comes into tight contact with upper and lower contact sections 232 and 241. At this point, pin 51 is in a narrow section of slot 11, with one side of pin 51 positioned against an inner surface 110 of slot 11, and the other side of pin 51 tightly pressing against upper and lower contact sections 232 and 241. It is apparent, therefore, that terminal 2 possesses two non-opposing conducting surfaces, so that, in the event that one conducting surface loses elasticity, there is still another conducting surface affording conductivity and insuring a good electrical connection.

Figure 8:
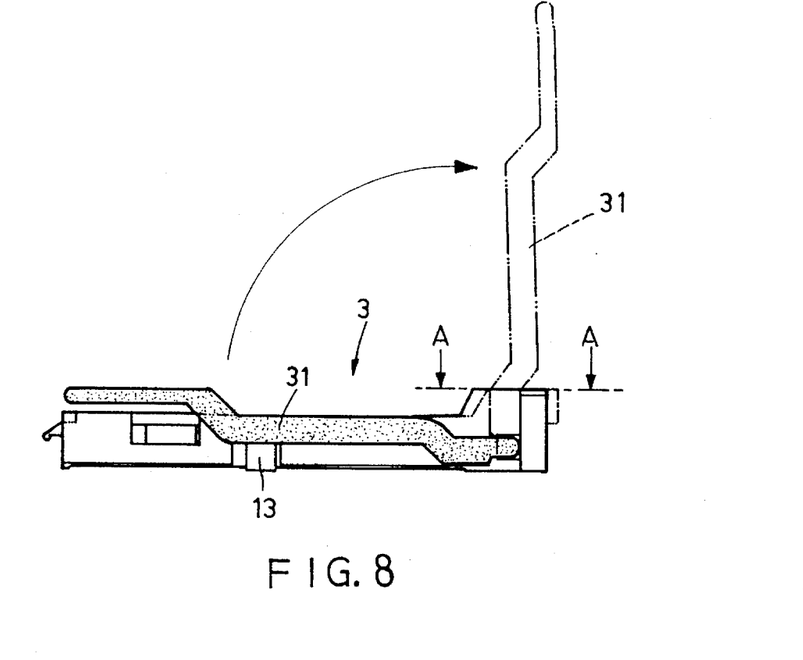
FIG. 8 is a side view of a driving rod according to the invention.
Figure 8A:
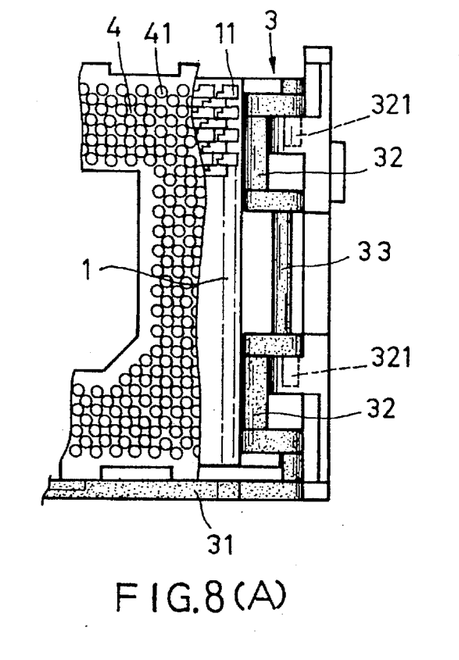
FIG. 8(A) is a partially sectioned plan view of the driving rod in the "on" position; and, FIG. 8(B) is a partially sectioned plan view of the driving rod in the "off" position.
Figure 8B:
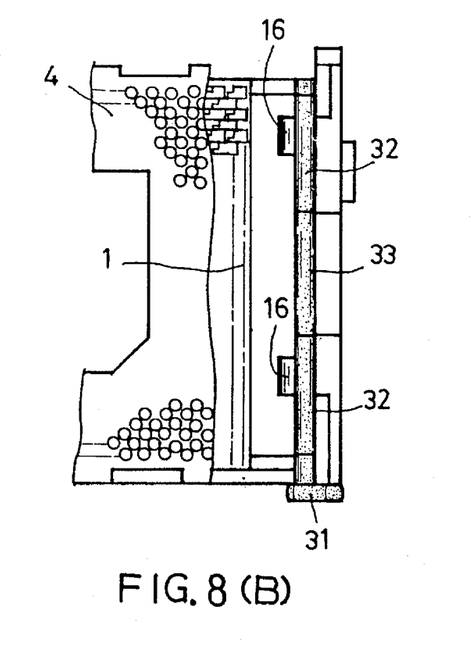

Referring to FIG. 8 as well as FIGS. 2, 4, and 5, the structure of driving rod 3 is shown. A driving section 33 is positioned between two U-shaped bodies 32. The two U-shaped bodies 32 each extend between opposing sides of respective positioning flanges 16 with the pegs 321 extending from an inner surface thereof. Pegs 321, having a common axis of symmetry, are inserted into positioning holes 161. Driving section 33 is positioned in slot 45 of sliding base 4. Driving section 33 is slightly higher than pegs 322, thereby forming an eccentric. In this way, when lever arm 31 of driving rod 3 is moved, driving section 33 uses pegs 321 to form a pivot point so that driving section 33 cooperates with slot 45 to cause a side-to-side motion that slides sliding base 4 relative to socket 1.

The invention as described herein, thus, provides the following benefits:

1. Terminal 2 is designed to accommodate the densely packed small slots 11 of ZIF socket 1. When a metal piece is punched and formed, the metal piece forms upper and lower conducting surfaces 232 and 241, allowing pins 51 to come in close contact with terminal 2, thereby exhibiting an excellent conducting function.

2. When stopping section 20 of terminal 2, comprising long flexible support section 21 and short flexible section 22, is bent to one side and then extended upwards, it enables the front of lead surfaces 231 and 242 to form a larger insertion space (S), as shown in FIG. 6(A) and 7(A). It also allows pins 51 to not come into contact with contact section 23 or 24 when being inserted in slots 11, thereby preventing pins 51 or terminal 2 from bending or breaking.

3. Driving rod 3 uses a pair of pegs 321 respectively extending from the inner sides of two U-shaped bodies 32 as a rotation pivot point. Protrusion 44 of sliding base 4 fits exactly between the two U-shaped bodies 32, thus, preventing driving section 33 from moving to the left or right. Protrusion 44 also can push the high density pins 51 to the side firmly and, thus, prevent the front edge of the sliding base 4 from popping up.

Although the present invention has been described in connection with preferred embodiments thereof, many other variations and modifications will now become to those skilled in the art without departing from the scope of the invention. It is preferred, therefore, that the present invention not be limited by the specific disclosure herein, but only by the appended claims.

What is claimed is:

1. An electrical connector, comprising: a socket member having an upper surface and a lower surface and a plurality of slots formed therethrough in a grid-like pattern, said socket member having opposing side edge surfaces, each of said side edge surfaces having a pair of stoppers integrally formed thereon, said socket having a front edge portion, said front edge portion having a notch portion and a horizontal surface portion formed therein, said horizontal surface having a pair of spaced positioning flanges formed thereon, each of said pair of positioning flanges having a positioning hole formed in one side thereof;

a sliding base member having an upper surface and a lower surface and a plurality of insertion holes formed therethrough, said sliding base member lower surface facing said socket member upper surface, said sliding base member insertion holes being positioned in alignment with said socket member slots, said sliding base member having opposing side walls for receiving said socket member side edge surfaces therebetween, each of said side walls having a pair of elongated apertures formed therethrough for respectively receiving said stoppers of said socket member therein, said stoppers of said socket member and said elongated apertures cooperating to slidingly couple said socket member of said sliding base member, said sliding base member having a protrusion slidingly receivable within said notch of said socket member, said protrusion having a lower edge with a slot formed therein;

driving rod means having a portion thereof disposed within said slot of said sliding base member protrusion and being pivotally coupled to said pair of positioning flanges for displacing said sliding base member relative to said socket member, said driving rod means including a lever arm extending from an end thereof for rotating said driving rod means with respect to said position flanges, said driving rod means including a pair of spaced U-shaped members, each of said U-shaped members having a peg extending therefrom and rotatably disposed within a respective one of said positioning holes, said pegs defining a rotational axis of said driving rod means; and, a plurality of electrically conducting longitudinally extending terminals respectively disposed within said plurality of slots, each of said plurality of terminals being punched from a piece of sheet metal, each of said terminals having a stopper section and a contact base member extending longitudinally in a first direction therefrom, each said terminal having a long flexible support member extending longitudinally from said stopper section in a second direction, said second direction being opposite said first direction, said long flexible support member having a first contact section formed at a distal end thereof, said first contact section having a sloping contact portion leading to an upper contact surfaces portion, each said terminal further having a short flexible support member extending from said stopper portion in said section direction, said short flexible member having a second contact section formed at a distal end thereof, said second contact section having a lead surface leading to a lower contact surface portion, said lower contact surface portion being in aligned and longitudinally spaced relationship with said upper surface contact portion for contacting a pin inserted into a respective one of said insertion holes responsive to said displacement of said sliding base member, wherein the pin is contacted by both said upper and lower contact surface portions on one side thereof and by an inner surface of a respective one of said plurality of slots of said socket member on an opposing side.

2. An electrical connector as recited in claim 1, wherein said driving rod means includes a driving section extending between said pair of U-shaped members and disposed within said slot of said sliding base member protrusion, said driving section being offset from said rotational axis for imparting a force against said sliding base member protrusion to slidingly displace said sliding base member relative to said socket member responsive to a rotative displacement of said lever arm.

\* \* \* \* \*